United States Patent [19]
Lattimore et al.

[11] Patent Number: 5,896,399
[45] Date of Patent: Apr. 20, 1999

[54] SYSTEM AND METHOD FOR TESTING SELF-TIMED MEMORY ARRAYS

[75] Inventors: George McNeil Lattimore, Austin; Michael Kevin Ciraula, Round Rock, both of Tex.; Dieter F. Wendel, Schoenaich, Germany; Manoj Kumar, Austin, Tex.; Friedrich-Christian Wernicke, Holzgerlingen, Germany

[73] Assignee: International Business Machines Corporation, Armonk, N.Y.

[21] Appl. No.: 08/763,493

[22] Filed: Dec. 11, 1996

[51] Int. Cl.⁶ .................................................. G11C 29/00
[52] U.S. Cl. ...................................... 371/21.4; 371/21.1
[58] Field of Search ............................ 371/21.1, 21.4; 326/45, 226

[56] References Cited

U.S. PATENT DOCUMENTS 3,961,250  6/1976  Snethen ................................ 371/21.1
5,008,569  4/1991  Roy ...................................... 326/45
5,748,012  5/1998  Beakes ................................. 326/93

*Primary Examiner*—Phung M. Chung
*Attorney, Agent, or Firm*—Anthony V. S. England

[57] ABSTRACT

The present invention applies a Static Evaluate technique to a memory array in a selective manner that allows some parts of the array to use the technique, and yet keeps the array area and timing unaffected for normal operation. The present invention allows the decode functions of the memory array to become pseudo-static during a first part of a clock cycle. In addition, if a write function is being performed, the write data is also held pseudo-static and is not written until a second part of a clock cycle when all addresses and data have stabilized. The invention can be used for system debug, product bring-up, or burn-in, even if there are non-functional race paths. A system and method of testing and burning in self-timed memory arrays includes a Static Evaluate circuit applied to the decoding function and the writing function of the array, a circuit for holding an address or write data inactive for the first part of a cycle, a circuit for activating the address or write data for the second part of a cycle, and a circuit for ensuring that the array resets correctly.

36 Claims, 10 Drawing Sheets

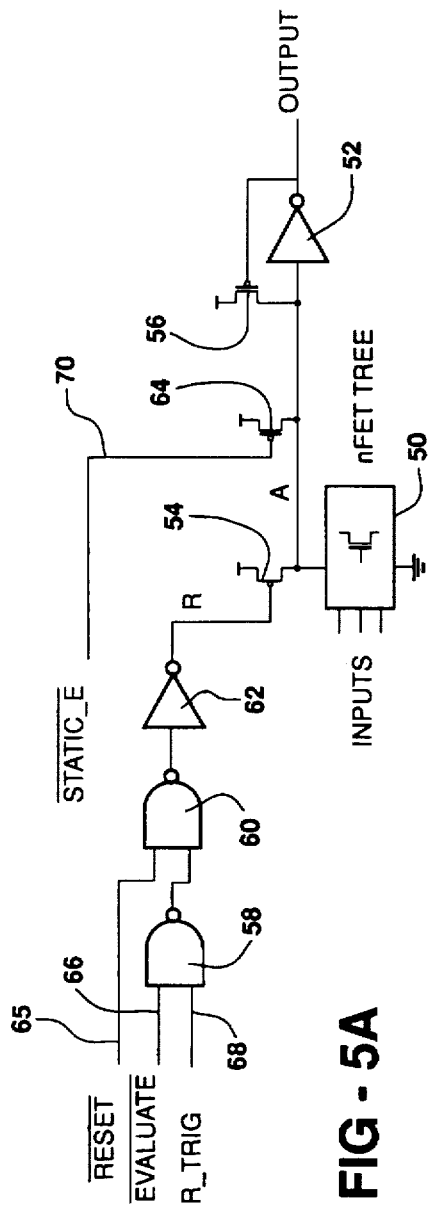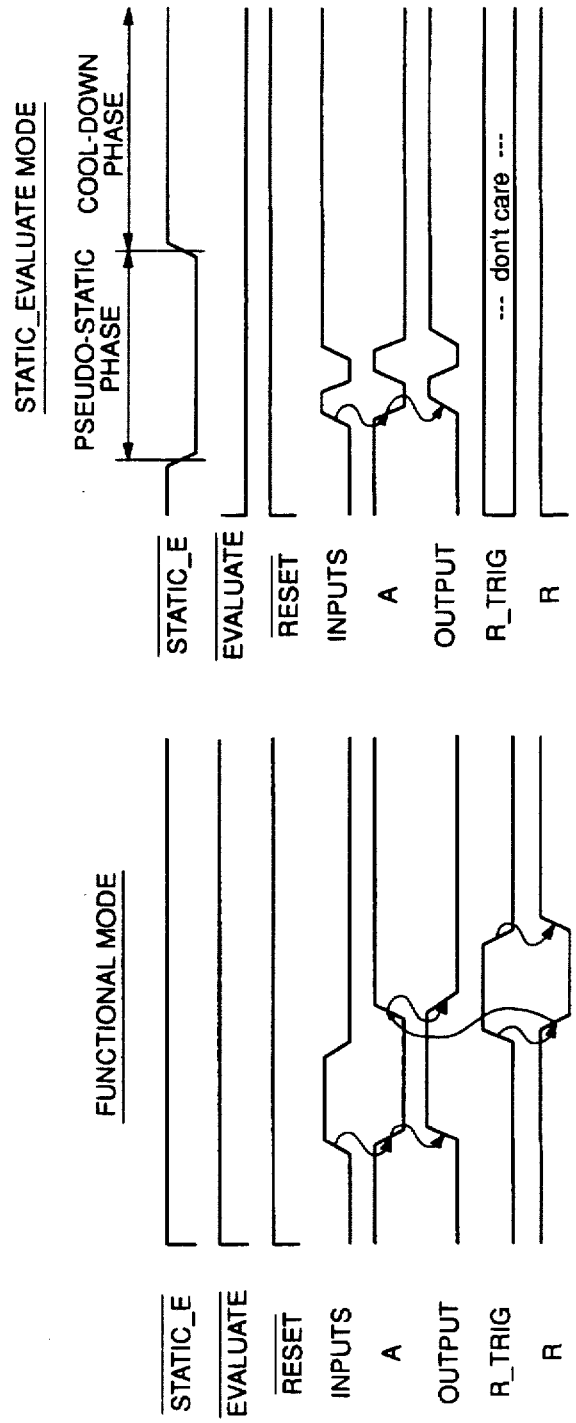

SYSTEM AND METHOD FOR TESTING SELF-TIMED MEMORY ARRAYS

CROSS-REFERENCE TO RELATED APPLICATIONS

The subject matter of this application is related to application Ser. No. 08/583,300 for "Methodology to Test Pulsed Logic Circuits in Pseudo-Static Mode" by T. Chappell, R. Haring, T. Jabar, E. Seewann, and M. Beakes, filed on Jan. 5, 1996, and assigned to a common assignee with this application. The foregoing application is incorporated herein by reference.

FIELD OF THE INVENTION

The present invention relates to memory arrays. More particularly, the invention pertains to a system and method for testing and burning in self-timed or self-resetting memory arrays.

BACKGROUND OF THE INVENTION

A self-timed or self-resetting memory array is a memory array that uses dynamic pulse circuit techniques, which assumes pulsed signals applied to the inputs. In logic circuits, such as those used to select addresses within the memory device, data (logical 0s and 1s) are represented by dynamic pulses on a node, rather than static voltage levels. Although there are performance advantages, pulsed logic and self-timed arrays also pose some problems regarding testability. Prior art self-timed memory arrays are often difficult to debug due to race conditions, and difficult to adequately stress during burn-in.

Race conditions may occur when two pulses that are intended to AND do not arrive with sufficient overlap to ensure the proper evaluation. Also, race conditions may occur when one signal in the AND is supposed to be off before the second signal arrives. If the second signal arrives early, while the first signal is turning off, the circuit may evaluate incorrectly, causing the wrong logic state to be propagated.

An example of this type of race condition in the prior art is shown in FIGS. 1 and 2. In FIG. 1, Input A 10 and Input B 12 are both active high. Both inputs must remain high for a sufficient overlap of time to cause INT 14 to go low, and thus the word line 16 to go high. A timing diagram is shown in FIG. 2. As shown, if Input A 10 and Input B 12 go high and overlap for a sufficient period of time, INT 14 will go low, and the word line 16 will go high. However, when an unacceptable A–B skew occurs and Input A 10 and Input B 12 do not overlap, INT 14 will remain high, and word line 16 will not go high.

Race conditions for addresses or data can occur due to a variety of problems:

1. Voltage variations across the chip.
2. Temperature variation due to local power heating.
3. Variations in poly-silicon line width can cause variations in the effective current of the CMOS transistors.
4. Variations in wiring, wiring resistance, or coupling.
5. The particular design chosen by the design engineer.

An example of a particular design in which a race condition is a typical design constraint is illustrated in the prior art NOR-NAND decoder depicted in FIG. 3, along with its associated timing diagram in FIG. 4. As shown in FIG. 3, NOR circuit 30 is the input to WNOR 32. There is one NOR circuit 30 and one AND circuit 34 for each word line in the memory array. NFET 36 can be shared across many word line decoders. To accomplish this, one nFET 36 would be connected to half of the AND circuits 34, and a second nFET would be connected to the other half of the AND circuits 34.

The function of NOR circuit 30 is to deselect all but one WNOR 32. All WNOR 32 lines are precharged high and then all but one are deselected, or pulled low, before ADD4 38 goes high. Both WNOR 32 and ADD4 38 must be active high for a sufficient overlap in time in order for INT 40, and thus the correct word line 44, to be selected.

The timing diagram in FIG. 4 illustrates the timing of the NOR-NAND decoder. For illustration purposes only, we assume two WNOR 32 lines and two word lines 44. As shown in FIG. 4, all WNOR 32 lines are precharged high. All WNOR 32 lines, with the exception of the selected WNOR 32, are deselected, i.e. the deselected WNOR 32 lines go low. ADD4 38 must come in high after the deselected WNOR 32 lines go low, and ADD4 38 and the selected WNOR 32 must overlap for a sufficient period of time in order for INT 40 to be discharged, causing the correct word line 42 to become active. It is important that all other WNORs 32 are deselected before ADD4 38 goes high. If two WNORs 32 are high (selected) at the same time, then when ADD4 38 goes high, causing node x 42 to go low, two word lines 44 will be selected at the same time.

Race conditions in hardware are difficult to debug and test. Furthermore, it is often difficult to distinguish between logic or software errors and timing errors.

Another problem with prior art self-timed memory arrays is that the decoders are not adequately stressed during burn-in. This is because the restore time of the decoders is usually independent of the cycle time. Yet another problem with prior art self-timed memory arrays is that the arrays are often not functional at burn-in. The solution in the prior art is to add extra noise margin to the array circuitry, such as the decoders. This allows the arrays to be functional at burn-in. However, this approach adds additional delay time to the entire circuit, which is not desirable after the array has been burned in and is operating in functional mode.

Consequently, it would be desirable to have a self-timed memory array that could function properly at a slower cycle time, even when race conditions cause the array to be non-functional at the expected clock frequency. It would also be desirable to have controlled address selection to prevent multiple word lines from being selected, and to have the address lines reset correctly. In addition, it would be desirable to have controlled writing of data to memory locations, so that while the data to be written is settling out, it is not inadvertently written, and so that data (whether correct or erroneous) is not written to a wrong location in the array while the logic is stabilizing. Finally, it would be desirable to have a self-timed array where the decoding could be slowed to allow for more stress coverage during burn-in and where the array would be functional at burn-in without the addition of extra noise margin.

SUMMARY OF THE INVENTION

Accordingly, the present invention applies a Static Evaluate technique in a selective manner that allows some parts of the array to use this technique, and yet keeps the array area and timing unaffected for normal operation. The present invention allows the decode functions of the memory array to become pseudo-static during a first part of a clock cycle. In addition, if a write function is being performed, the write data is also held pseudo-static and is not written until a second part of a clock cycle when all addresses and data have stabilized. The term "pseudo-static" is used to refer to a period of time in which an address or data is given time to stabilize. During "pseudo-static" time, the address and write data are not presented to the memory array, and are also not allowed to reset.

The invention can be used for system debug, product bring-up, or burn-in, even if there are non-functional race paths. A system and method of testing and burning in self-timed memory arrays includes a Static Evaluate circuit applied to the decoding function and the writing function of the array, a circuit for preventing an address or write data from being used during the pseudo-static first part of a cycle, a circuit for activating the address or write data during the second part of a cycle, and a circuit for ensuring that the array resets correctly.

One advantage of the present invention is that it allows the engineer to verify the logic model and debug the software even when race conditions would otherwise cause the array to be non-functional at the expected clock frequency. The invention also prevents multiple word lines from being selected, prevents data that has not yet settled out from being inadvertently written, and ensures that the address lines and data lines reset correctly. The present invention has the further advantage of ensuring adequate stress coverage during burn-in, and array functionality at burn-in without adding additional delay during functional mode.

BRIEF DESCRIPTION OF THE DRAWINGS

FIG. 5A is a circuit diagram of a Static Evaluate circuit, as applied to a pulsed logic circuit.

FIG. 5B is a timing diagram of the circuit of FIG. 5A operating in functional mode.

FIG. 5C is a timing diagram of the circuit of FIG. 5A operating in Static Evaluate mode.

DETAILED DESCRIPTION OF A PREFERRED EMBODIMENT OF THE INVENTION

Figure 1:
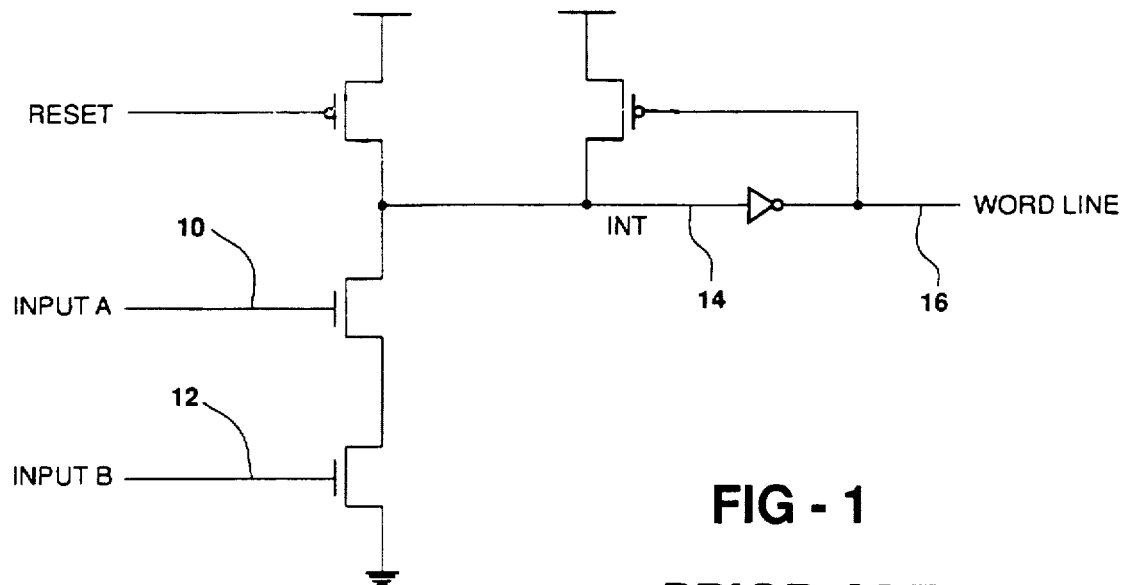
FIG. 1 is a circuit diagram of a prior art AND gate, illustrating a potential race condition.
Figure 2:
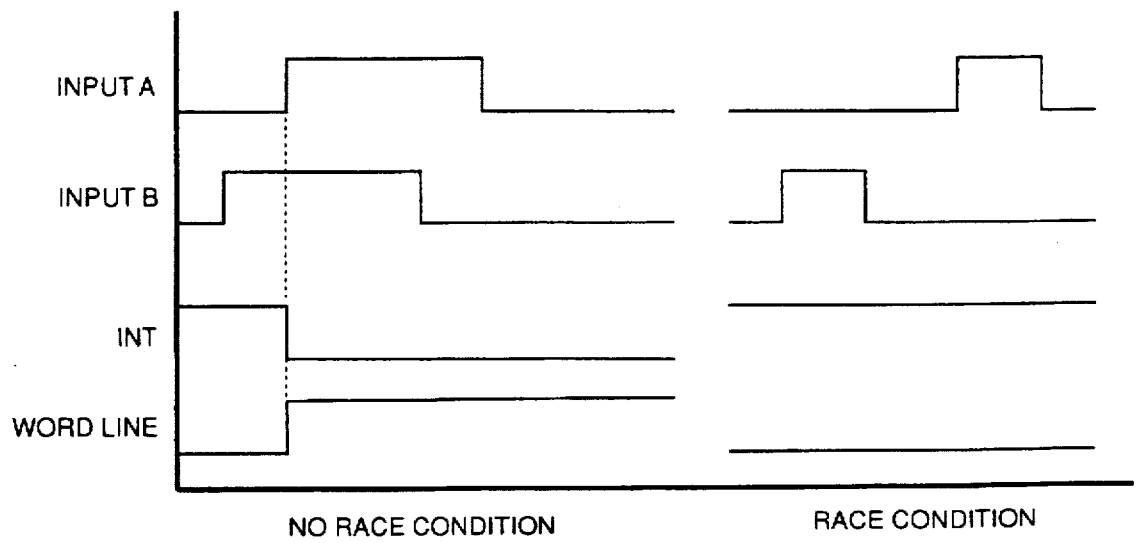
FIG. 2 is a timing diagram of the circuit shown in FIG. 1.
Figure 3:
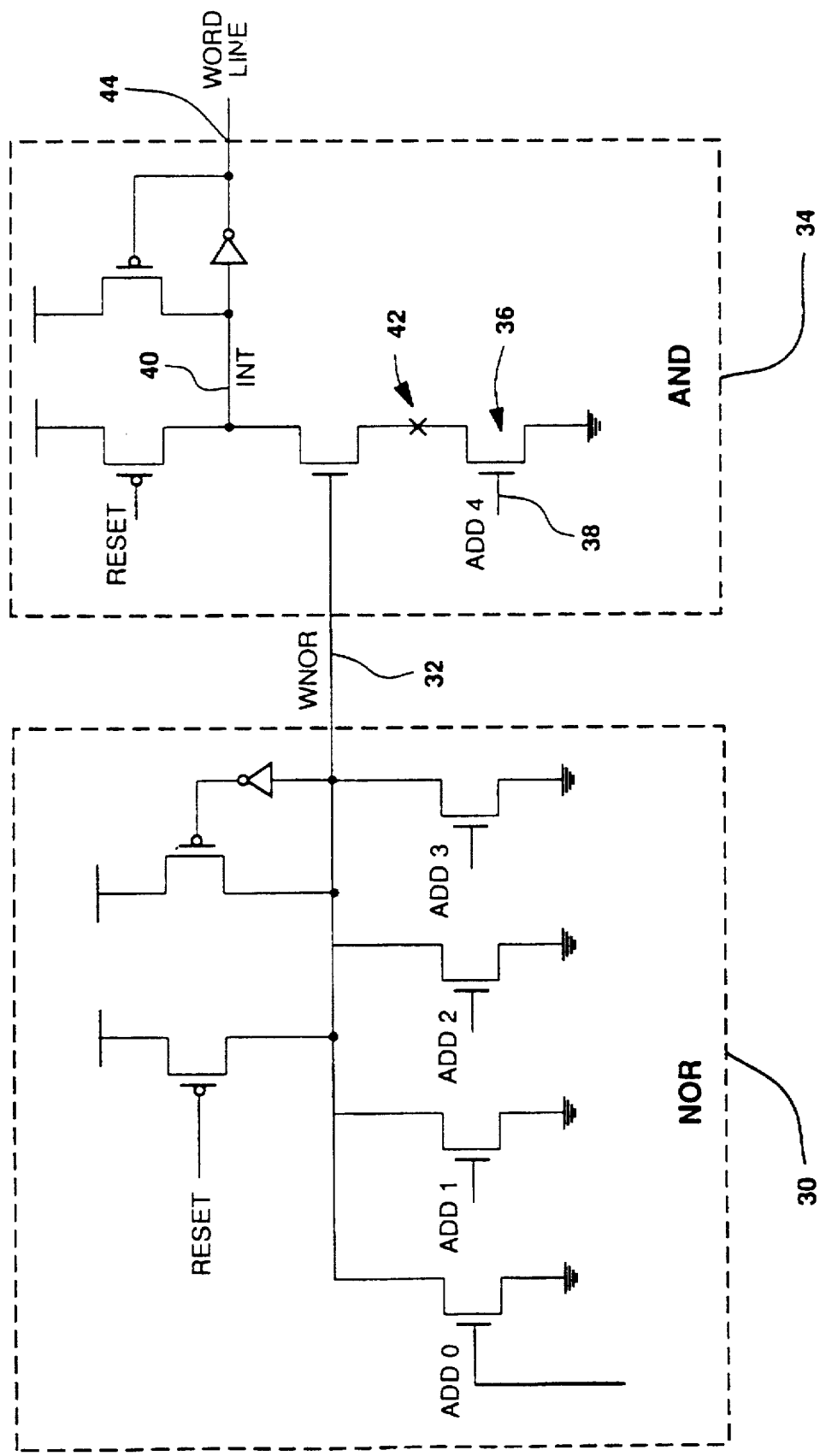
FIG. 3 is a circuit diagram of a prior art NOR-NAND decoder, illustrating a potential race condition.
Figure 4:
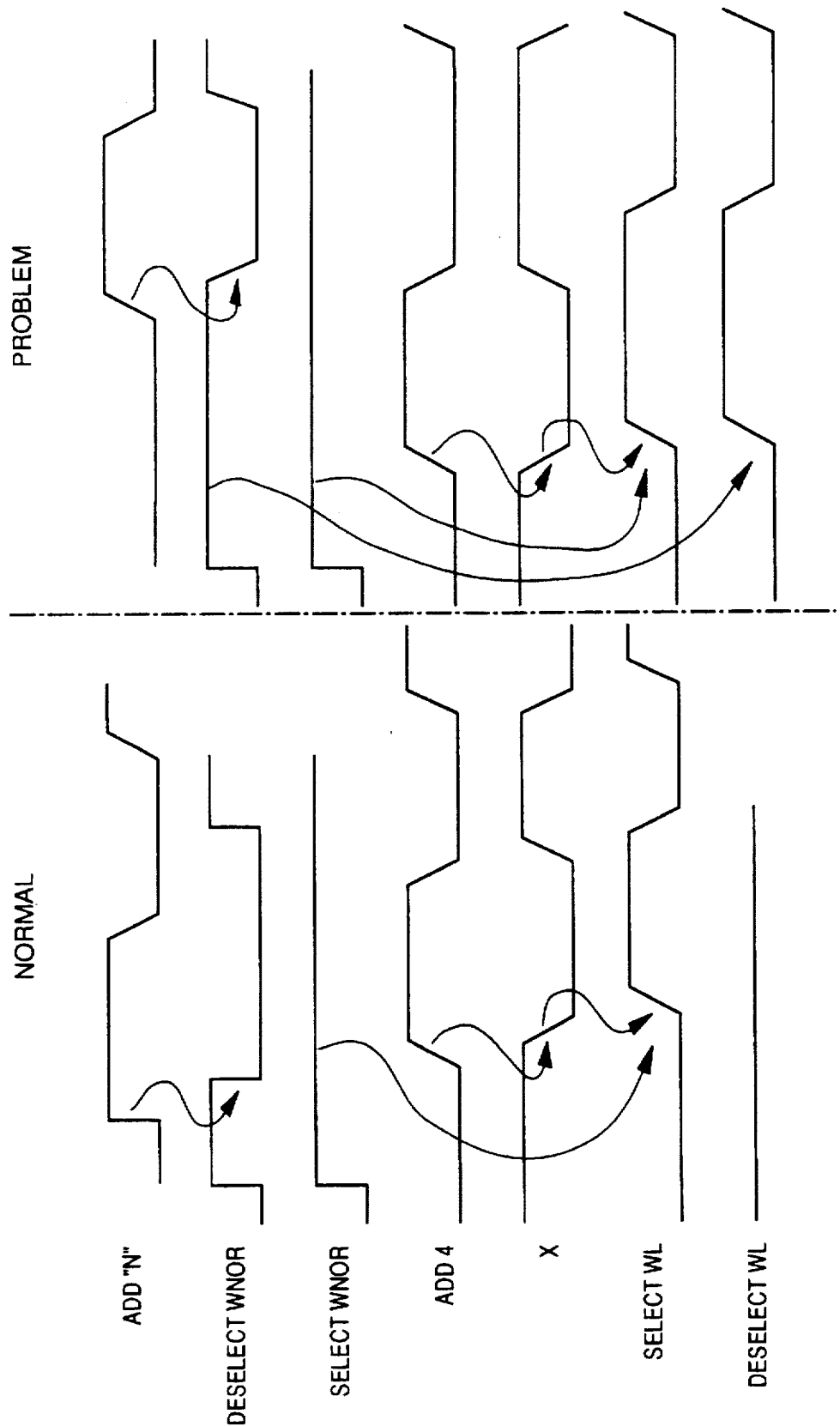
FIG. 4 is a timing diagram of the circuit shown in FIG. 3.

FIGS. 1 through 4 have been described above in the background of the invention section herein.

A technique referred to as Static Evaluate allows testing, evaluation, and debug of pulsed logic circuits in "pseudo-static mode." This technique turns dynamic circuits into static logic by causing the reset devices to be inactive and replaced by slow static restore devices. FIG. 5A depicts a Static Evaluate circuit as it applies to pulsed logic circuits.

Referring now to FIG. 5A, a generic dynamic circuit, comprising a generic nFET pull-down tree 50 performing a desired logical function, an output inverter 52, and a reset or pre-charge device 54 is shown. A standby device 56 is provided to hold evaluation node A in its high standby state (and, therefore, the output low) when neither 54 is activated, nor the nFET tree 50 pulls down. Gates 58, 60 and 62 provide, schematically, the last stage of the reset/pre-charge circuitry. Notice that 58, 60 and 62 may be shared among many individual circuits that share the same node R.

In normal functional operation, $\overline{Reset}$ 65 the (locally inverted and buffered form of a global signal Reset) and $\overline{Evaluate}$ 66 (the locally inverted and buffered form of a global signal Evaluate) are both high. During power-on-reset of the circuit, and during a leakage test in reset mode, the global signal Reset is asserted ($\overline{Reset}$ 65 goes low), forcing the evaluation node A to its reset or stand-by state. That is, when $\overline{Reset}$ 65 goes low, the output of NAND 60 will be high, the output of inverter 62 will be low, turning on pFET 54, and pulling evaluation node A high.

To inhibit the pulsed logic from resetting (so that evaluation node A remains in its evaluated state given by the inputs to the nFET-tree 50), the global signal Evaluate is asserted ($\overline{Evaluate}$ 66 goes low), thereby inhibiting a reset. That is, when $\overline{Evaluate}$ 66 goes low, the output of NAND 58 will be high. If $\overline{Reset}$ 65 is also high, (no reset requested), the output of NAND 60 will be low, and the output of inverter 62 will be high, turning off pFET 54. Evaluation node A, therefore, will depend upon the state of the nFET tree. This feature is used for leakage tests. Similarly, it is used for burn-in, in order to provide a voltage stress on transistors in the active (evaluated) state for a duration longer than a typical pulse width.

In "Static Evaluate test mode," besides Evaluate, another global signal, Static_Evaluate, is also active. The locally inverted and buffered form, $\overline{Static\_E}$ 70, is applied to the gate of a small leakage transistor pFET 64. When pFET 64 is ON ($\overline{Static\_E}$ 70 is low), it converts the circuit of FIG. 5A effectively into a pseudo-nmos circuit. As shown in FIG. 5C, this is referred to as a "pseudo-static phase." It gives evaluation node A the ability to recover from false pulldown events in the n-tree, caused by glitches or noise. Specifically, when pFET 64 is conducting, evaluation node A will be pulled down in response to an input applied to nFET tree 50. However, evaluation node A will return to a high condition when the input is off. Since pulses are not reset in static evaluate test mode, the input signals and output signals behave as static signals. This eliminates problems with insufficient pulse coalescence in mistimed chips, so that at least in the Static Evaluate mode of operation, the circuits will correctly evaluate.

FIGS. 5B and 5C are timing diagrams for the circuit of FIG. 5A. In FIG. 5B, the circuit is operating in normal, functional mode. During normal operation, $\overline{Reset}$ 65 and $\overline{Evaluate}$ 66 are both high. If the inputs are such that the nFET logic tree evaluates, evaluation node A is discharged, giving rise to the output going high. Subsequently, evaluation node A will have to be reset to its standby state. This is effected by signal R_Trig 68, which can originate from a variety of sources.

In FIG. 5C, the circuit is operating in Static Evaluate mode. In Static Evaluate mode, $\overline{Static\_E}$ 70 is low for the entire pseudo-static period. Because $\overline{\text{Evaluate}}$ 66 is also held low, R_Trig 68 does not trigger a reset, as it does in functional mode. Therefore, R_Trig 68 is in a "don't care" state. During the pseudo-static phase, evaluation node A exhibits glitch and noise recovery. At the rising edge of $\overline{\text{Static\_E}}$ 70, all circuits should have evaluated to their final state, and the results can be latched into registers downstream. The Static Evaluate mode also includes a cool-down phase, which allows the circuit to dissipate heat generated by the circuit.

The Static Evaluate approach as designed for pulsed logic circuits does not work as well for self-timed memory arrays. To implement this approach on an array would require a large amount of space on the array. This is because extra pFET 64 would have to be added to every bit line in order to allow it to return to the precharged state. Additionally, this approach is not controlled enough to prevent multiple word lines from being selected and perhaps causing data to be inadvertently written to the wrong location in the array. Although all the logic would eventually come to a stable state and the correct word line would be chosen, there is no guarantee that data would not be spuriously written to an incorrect address while the logic was stabilizing. There is also no method for ensuring that the write data itself is not written before it is stabilized, or before it comes to a final, correct state. Finally, there is no provision for handling array resets and restores. Thus, use of this technique increases array area and delay without equivalent benefit.

Figure 6:
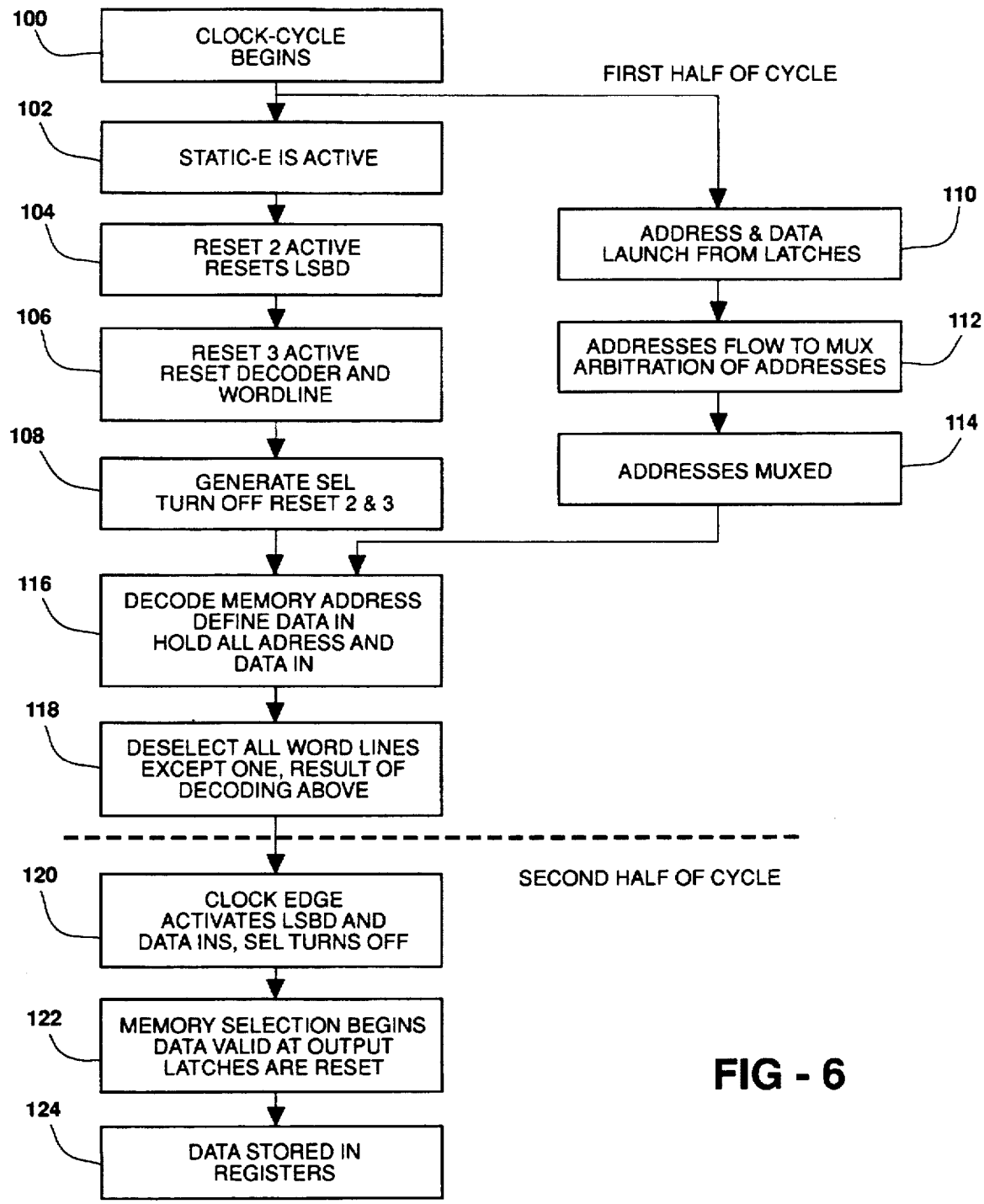
FIG. 6 is a flow chart illustrating the method of the present invention.

Referring now to FIG. 6, a flow diagram of the preferred embodiment of the present invention as it applies to a read operation is shown. Note that during Static Evaluate mode, the cycle time is fairly long, approximately 50–100 nanoseconds, whereas during normal operations the cycle time may be only 2.5–5 nanoseconds. In the present invention, some circuits have $\overline{\text{Static\_E}}$ as an input. These circuits operate similarly to the pulsed logic circuits described above. However, other circuits in the present invention have static evaluate latch (SEL) as an input, rather than $\overline{\text{Static\_E}}$. This is shown in greater detail in FIGS. 8 through 12.

The clock cycle begins (step 100). During Static Evaluate mode, $\overline{\text{Static\_E}}$ is active (step 102), and remains active throughout. Two resets take place at the very beginning of each clock cycle. First, the least significant bit (LSBD) is reset by $\overline{\text{Reset2}}$ 104). Next, the decoder and the word line are reset by $\overline{\text{Reset3}}$ 106). As will be shown in greater detail in FIGS. 8 through 12, the least significant bit generator, the decoder, and the word line are all circuits which have SEL as an input. Therefore, they must be actively reset at the beginning of a clock cycle by either $\overline{\text{Reset2}}$ or $\overline{\text{Reset3}}$. Two reset signals are required, as LSBD must be reset before the decoder and the word line are reset. In contrast, circuits that have $\overline{\text{Static\_E}}$ as an input do not have to be actively reset, as these circuits will reset, through the pseudo-static pFET pull-up, when their inputs go away. Next, SEL is asserted and the reset signals, $\overline{\text{Reset2}}$ and $\overline{\text{Reset3}}$ are turned off (step 108).

While steps 102 through 108 are executing, steps 110 through 114 are also executing. An address and data are launched from latches (step 110). Addresses flow to a multiplexer, and arbitration takes place (step 112). The addresses are multiplexed (step 114).

Next, a memory address is decoded, data in is defined, and the address and data are held (step 116). All address bits are held static during the first half of the clock cycle (step 118). The decoded portion of the LSB, referred to as LSBD, does not become active until the second half of the clock cycle. Therefore, two WNOR lines remain high until the LSB is fired.

During the second half of the clock cycle, the clock edge is used to fire LSBD (step 120). (Note that SEL also goes inactive during the second half of the clock cycle. This is shown in greater detail in later figures). Memory selection begins, data is valid at array output, and the input latches are reset (step 122). Finally, data is stored in output registers (step 124).

Although FIG. 6 illustrates the present invention as it deals with decoding memory addresses, the invention is not limited to decoding addresses to be read. It can also apply to the write data.

The word line is not active until the second half of a clock cycle during both a read and a write operation. During a write operation, this keeps data from being inadvertently written to a wrong memory location. In addition, during a write operation, the write data itself is allowed to settle, or stabilize, during the first half of the clock cycle. Once the write data is determined to be valid (i.e. stabilized) in the first half of the cycle, the data is held for the second half of the cycle, and then reset in the same manner as the word line (at the beginning of the next clock cycle). This ensures that only valid data is written into a correct address.

Note that in addition to using the present invention as it applies to word line selection and write data validation, the present invention may also be applied to each bit line of a memory array.

Also, the current embodiment of the present invention uses the LSB to actually fire the word line. However, this is only one of many ways in which the word line can be fired. Any number of bits can be used, or the clock edge alone can be used. The point of the present invention is that all dynamic portions of the array are given sufficient time to settle before any data is evaluated. We use the second half of the cycle to turn on the word line and write the data.

Figure 7:
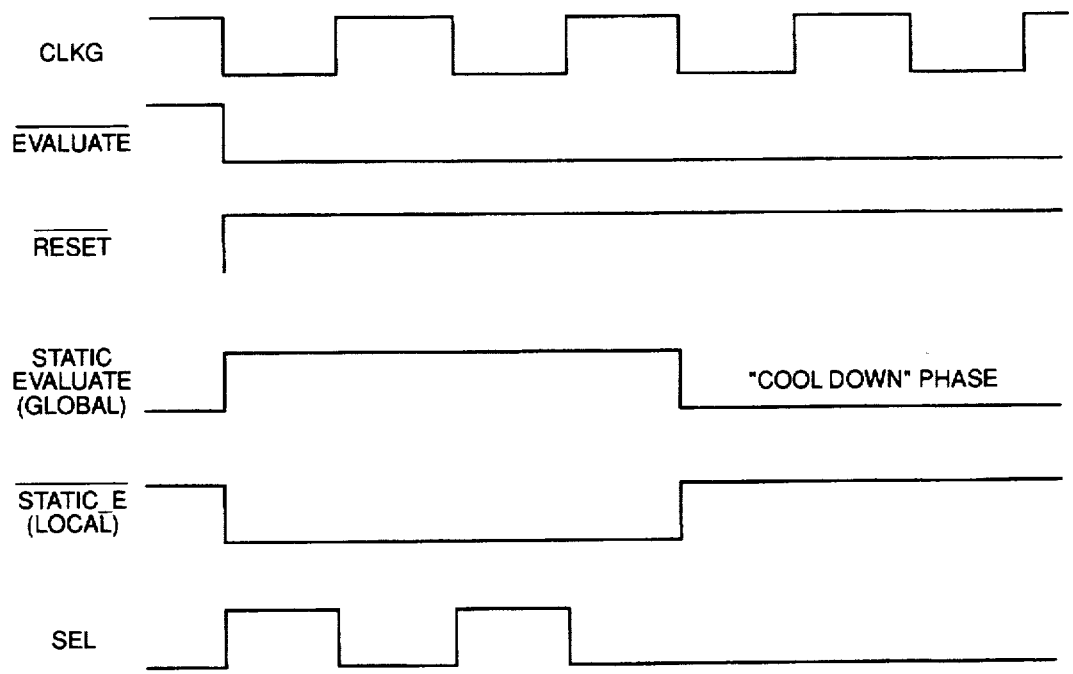
FIG. 7 is a timing diagram illustrating Static Evaluate signals as they are used in accordance with the present invention.

As noted above, the present invention uses some of the same signals used for logic circuits, but also adds unique signals, as shown in FIG. 7. Referring now to FIG. 7, a unique signal, SEL, is shown in its relation to previously discussed Static Evaluate signals. FIG. 7 shows CLKG, $\overline{\text{Evaluate}}$, $\overline{\text{Reset}}$, Static_Evaluate, and $\overline{\text{Static\_E}}$ just as they are used for pulsed logic circuits. However, a new signal, SEL, is used in the present invention. SEL is a pulsed signal, and is active high. As will be shown in more detail in FIGS. 8 through 12, some circuits in the present invention have $\overline{\text{Static\_E}}$ as an input, while others have SEL as an input.

Those circuits that have $\overline{\text{Static\_E}}$ as an input are never actively reset. In other words, they are statically reset, or reset when their inputs go away. These circuits are "static" for an entire clock cycle. In contrast, the circuits that have SEL as an input are "actively" reset at the beginning of each cycle. One of the key differences between using Static Evaluate techniques for logic circuits and using Static Evaluate techniques for memory arrays is that, for SEL circuits in the present invention, "pseudo-static time" only lasts for that portion of the first half of a clock cycle when resets are not occurring (which is almost the entire first half of the clock cycle).

Figure 8:
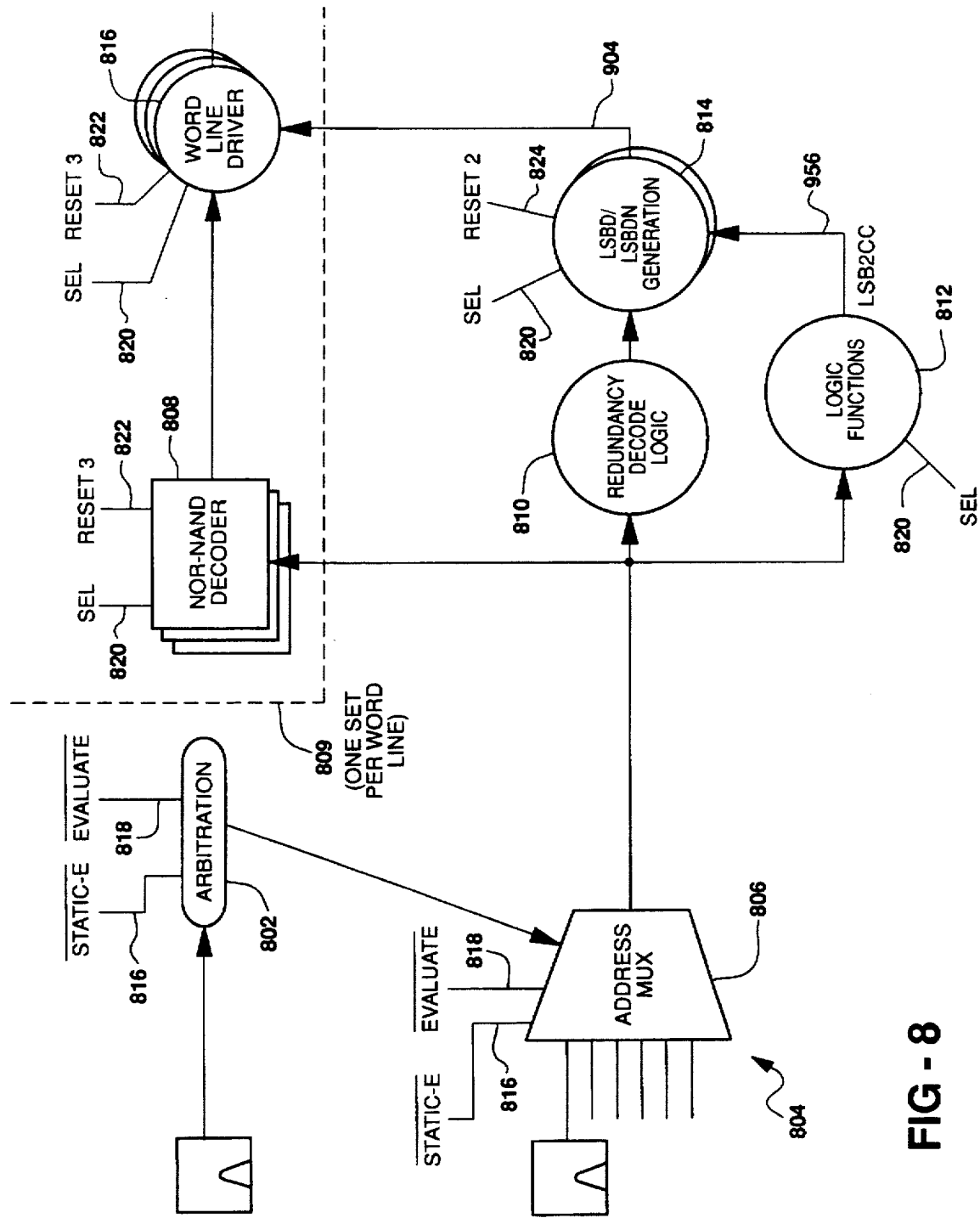
FIG. 8 is a block diagram of a self-timed array in accordance with the present invention.

FIG. 8 shows a block diagram of the present invention as it applies to decoding a memory address. An arbitration logic circuit 802 determines which of several addresses 804 to choose. The output of arbitration logic circuit 802 is input to address multiplexer 806 to choose one address. This address then goes to three different places. All the address bits, with the exception of the least significant bit (LSB) go to NOR/ NAND decoder 808, similar to the NOR/NAND decoder depicted in FIG. 3. During Static Evaluate mode, these high order bits are held static by use of a pFET (as shown in greater detail in FIG. 9), and are also actively reset by the same pFET.

The address is also sent to redundancy decode logic circuit 810. The purpose of the redundancy decode logic is to remap an address that may not be available in physical memory. This is not part of the present invention. The address also goes to logic circuit 812 which generates the least significant bit (LSB2CC 956).

Figure 10:
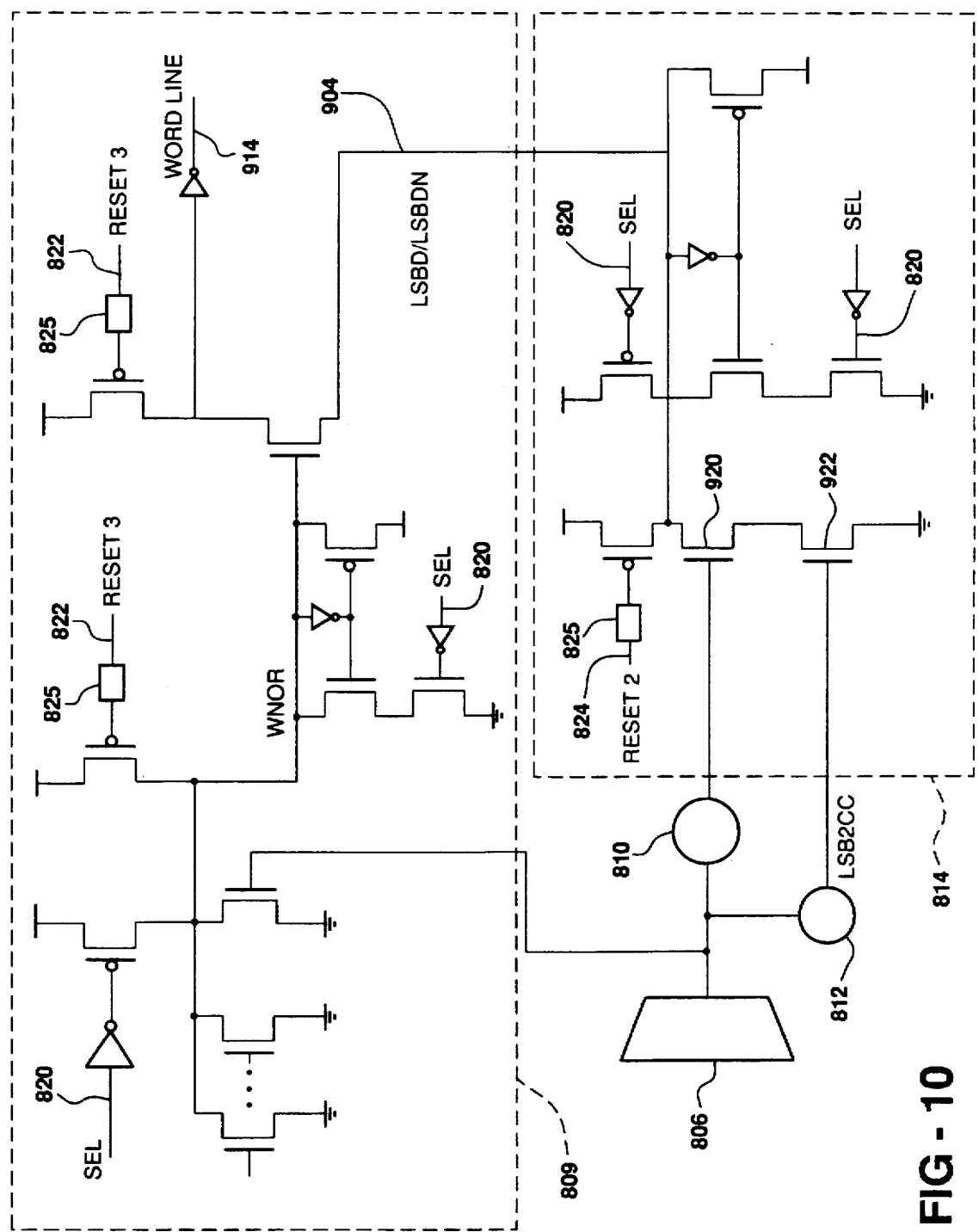
FIG. 10 is a circuit diagram, illustrating details of the block diagram of FIG. 8.

Logic circuit 812 is a key step in the present invention, and is illustrated in greater detail in FIG. 10. It is the means by which LSB2CC is prevented from becoming active until the second half of the clock cycle. Both the result of the redundancy decode logic and LSB2CC are input to logic circuit 814, which generates LSBD 904 (LSB Derived) and LSBDN 904 (LSB Derived Not). LSBD 904 is the strobe which triggers word line driver 816 to ultimately fire and select the correct word address.

A dashed line 809 has been drawn around NOR/NAND decoder 808 and word line driver 816 to indicate that there is one set, consisting of a NOR/NAND decoder 808 and a word line driver 816 for each word line. Also note that there are two 814 circuits present, one to generate LSBD and one to generate LSBDN.

It is important to note which circuits have $\overline{\text{Static\_E}}$ 816 as an input, and which circuits have SEL 820 as an input. Arbitration logic 802 and address multiplexer 806 have $\overline{\text{Static\_E}}$ 816 as an input. Note that they also have Evaluate 818 as an input. Evaluate 818 keeps these circuits from resetting as they normally would in functional mode. Therefore, these circuits are "static" for the entire clock cycle, and behave similarly to the Static Evaluate circuits discussed in FIG. 5A.

NOR/NAND decoder 808, word line driver 816, LSBD/ LSBDN generator 814 and logic circuit 812 have SEL 820 as an input. Thus, these circuits are reset initially and then held static through the first half of a clock cycle, after which they actively reset. Note that $\overline{\text{Reset3}}$ 822 is the signal that resets NOR/NAND decoder 808 and word line driver 816, and $\overline{\text{Reset2}}$ 824 is the signal that resets LSBD/LSBDN generator 814.

Figure 9:
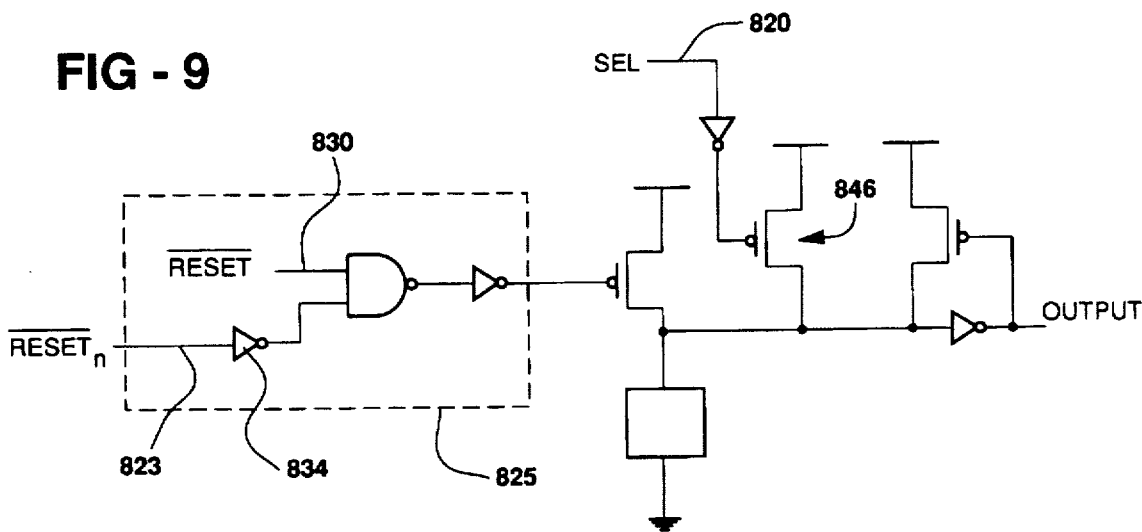
FIG. 9 is a circuit diagram of a Static Evaluate circuit in accordance with the present invention.

Referring now to FIG. 9, a typical dynamic circuit using SEL, as opposed to the circuit shown in FIG. 5A, will now be described. Note that there is no signal analogous to Evaluate in FIG. 9. As in FIG. 5A, Reset 830 is only used during power-on-reset. SEL 820 is applied to the gate of a small leakage transistor pFET 846. When pFET 846 is on (SEL 820 is high), the circuit is in a "pseudo-static" state. However, unlike FIG. 5A, the circuit can be actively reset through the use of $\overline{\text{Reset2}}$ 824 or $\overline{\text{Reset3}}$ 822. Also, SEL is a pulsed signal, rather than a signal which is asserted for the entire clock cycle, as is $\overline{\text{Static\_E}}$. As shown in FIG. 9, Reset$_n$ 823 is used to actively reset the circuit. Reset$_n$ is further defined in FIG. 10, as either $\overline{\text{Reset2}}$ 824 or $\overline{\text{Reset3}}$ 822 (see FIG. 10). Two different reset signals are required, as LSBD must be reset before the decoder and the word line. Note that a dashed line is drawn around part of the circuit of FIG. 9. This is used to simplify the circuit diagram of FIG. 10, and is shown in FIG. 10 as circuit 825.

Referring now to FIG. 10, the invention will be described in greater detail. As discussed above, when SEL 820 is high, the self-timed memory array is in pseudo-static mode. SEL 820 remains high for the first half of a clock cycle. This holds the high-order address bits of the selected address static during the first half of the clock cycle. During the second half of the clock cycle, the least significant bit (LSBD/LSBDN) 904 is fired, and the correct word line 914 is then selected.

During Static Evaluate mode, the decode portions of the circuit are prevented from resetting until the very beginning of the next clock cycle. These circuits are reset through the use of $\overline{\text{Reset2}}$ 824 and $\overline{\text{Reset3}}$ 822.

Referring back to FIG. 3 of the prior art, it is interesting to note that nFET 36 in FIG. 3 is implemented through the use of nFETs 920 and 922 in FIG. 10. NFETs 920 and 922 implement the "strobe" used to fire word line 914 in the described embodiment of the present invention.

Figure 11:
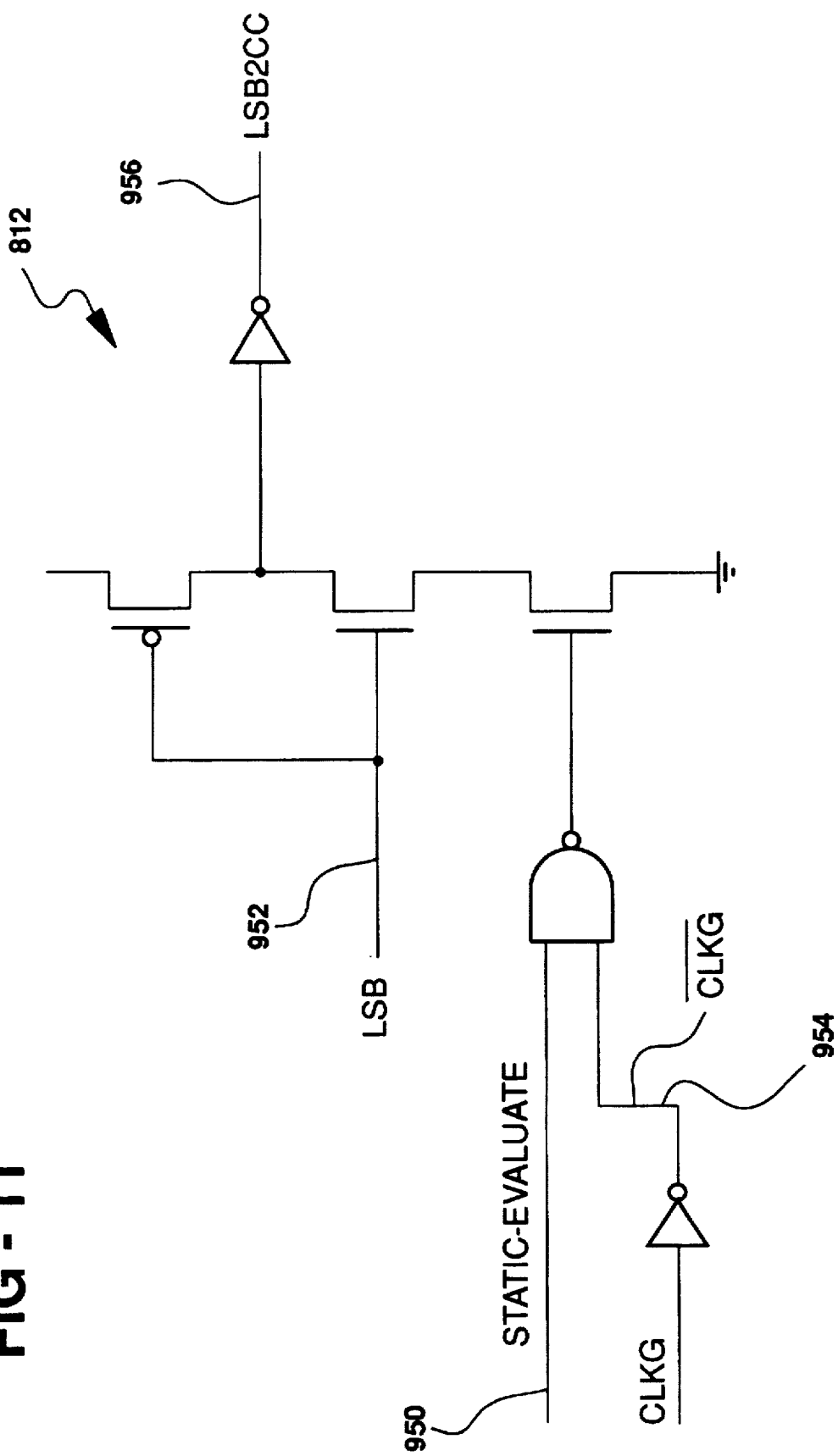
FIG. 11 is a detailed circuit diagram of one portion of the circuit diagram of FIG. 10.

Referring now to FIG. 11, a detailed circuit diagram showing how logic function 812 generates LSB2CC 956 will be described. FIG. 11 illustrates the means used in the preferred embodiment of the invention for holding back the firing of the word line. In the described embodiment of the invention, the clock is used to gate a piece of the address, in this case the LSB 952. However, there are many other ways in which logic circuit 812 can be implemented. A group of bits can be gated, or all address bits can be allowed to settle out, and the clock alone can be used to fire the word line.

In the described embodiment of the present invention, when Static_Evaluate 950 (a global signal) is high, LSB 952 is held back until it is triggered by the falling edge of $\overline{\text{CLKG}}$. LSB2CC 956 is the output of logic circuit 812, and is propagated to LSBD/LSBDN generator 814, as shown in FIGS. 9 and 10.

Figure 12:
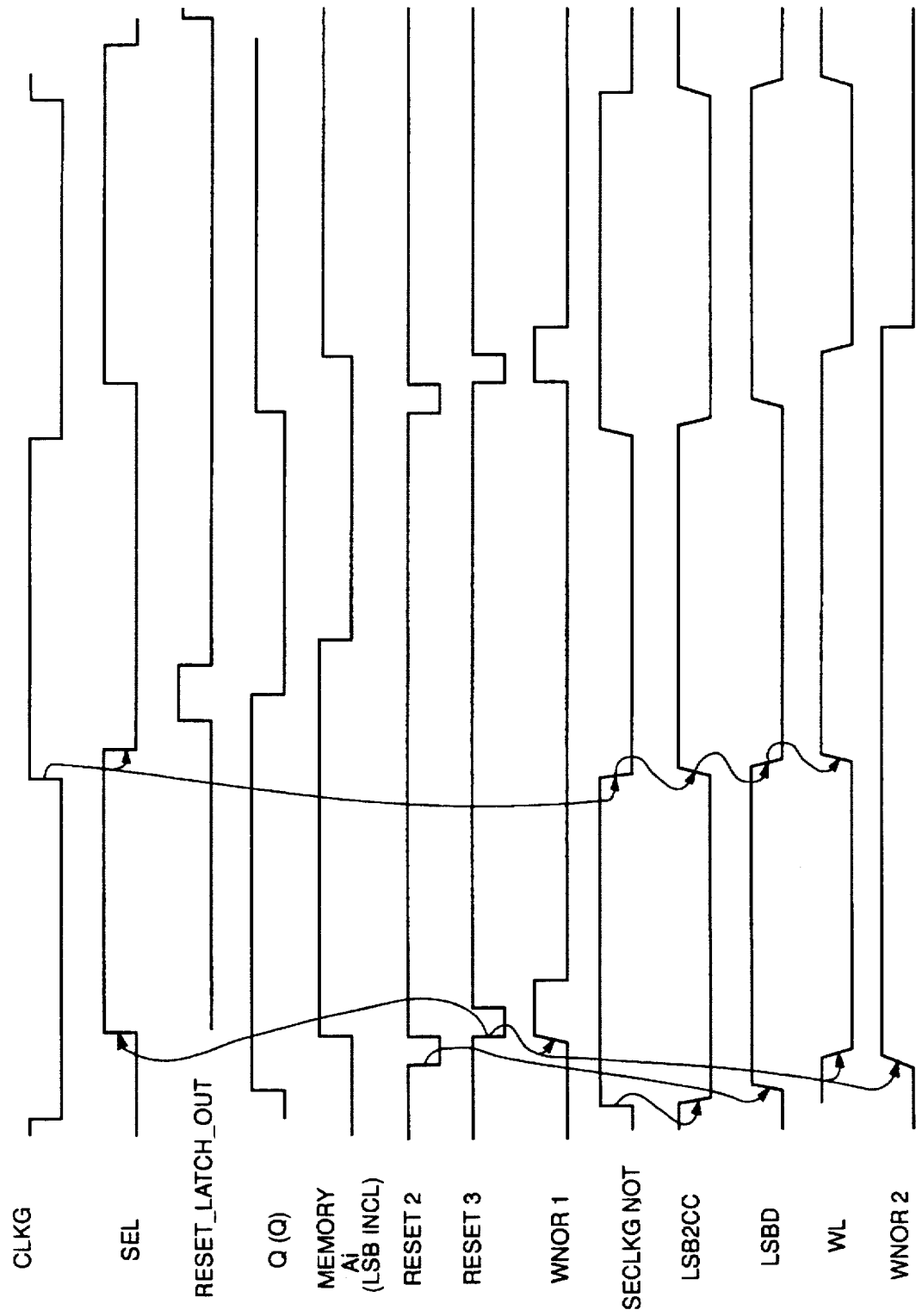
FIG. 12 is a timing diagram in accordance with the present invention.

Referring now to FIG. 12, a timing diagram of the Static Evaluate mode will be described. As shown, SEL is high during the first half of the clock cycle, CLKG. When CLKG goes low, it triggers Q (data from the latch) to go high, thus causing addresses to flow to the multiplexer. Once arbitration is complete, and the addresses arrive at the multiplexer, the multiplexer output becomes valid. When the address bits from the multiplexer become valid, all WNORs, except for one, are deselected. In FIG. 12, WNOR1 is deselected, whereas WNOR2 remains selected. Thus, WNOR2 will be the selected address in this case. It is important to note that WNOR1 must not be restored high until LSBD is high.

When goes CLKG low, it triggers LSB2CC to go low. During the second half of the clock cycle, CLKG goes high, and LSB2CC goes high, thus causing LSBD to go low, and act as a strobe to fire the word line. Thus, the correct word line is fired in the second half of the clock cycle. Again, it is important to note that LSBD must go high (be restored) before WNOR1 is restored high.

Note that $\overline{\text{Reset2}}$ causes LSBD to be reset at the very beginning of the first half of a clock cycle, and $\overline{\text{Reset3}}$ causes all WNORs and the word line to be reset at the very beginning of a clock cycle. SEL can not become active until $\overline{\text{Reset3}}$ goes active.

Although the invention has been described with a certain degree of particularity, it should be recognized that elements thereof may be altered by persons skilled in the art without departing from the spirit and scope of the invention. A NOR/NAND decoder is used for illustration purposes only. The present invention may be used for any array exhibiting a race condition, including content addressable memory (CAM) arrays. The invention is limited only by the following claims and their equivalents.

What is claimed is:

1. A method for evaluating a memory array, comprising the steps of:

decoding a memory address for addressing selected storage cells within the memory array;

asserting a static-evaluate signal to provide a pseudo-static state at least at one evaluation node, said pseudo-static state enabling input signals to the memory array to stabilize to produce a stable signal at the respective evaluation node; and deactivating said static-evaluate signal upon the occurrence of a predetermined event to allow said input signals to be presented to the memory array.

2. A method for evaluating a memory array according to claim 1, wherein said input signals to the memory array comprise one or more decoded address lines.

3. A method for evaluating a memory array according to claim 1, wherein said input signals to the memory array comprise one or more bit lines.

4. A method for evaluating a memory array according to claim 1, wherein said input signals to the memory array comprise one or more write enable lines.

5. A method for evaluating a memory array according to claim 1, wherein the step of asserting a static-evaluate signal further comprises the steps of:

asserting one or more reset signals to reset said input signals to the memory array; and asserting said static-evaluate signal after all reset signals have been asserted.

6. A method for evaluating a memory array according to claim 1, further comprising the steps of:

resetting a memory decoder during a first part of a clock cycle;

asserting said static-evaluate signal during a second part of said clock cycle;

deactivating said static-evaluate signal during a third part of said clock cycle; and preventing said memory decoder from resetting during said second part and said third part of said clock cycle.

7. A method for evaluating a memory array according to claim 1, further comprising the steps of:

resetting a word line during a first part of a clock cycle;

asserting said static-evaluate signal during a second part of said clock cycle;

deactivating said static-evaluate signal during a third part of said clock cycle; and preventing said word line from resetting during said second part and said third part of said clock cycle.

8. A method for evaluating a memory array according to claim 1, further comprising the steps of:

resetting one or more bit lines during a first part of a clock cycle;

asserting said static-evaluate signal during a second part of said clock cycle;

deactivating said static-evaluate signal during a third part of said clock cycle; and preventing said one or more bit lines from resetting during said second part and said third part of said clock cycle.

9. A method for evaluating a memory array according to claim 1, further comprising the steps of:

resetting a write enable signal during a first part of a clock cycle;

asserting said static-evaluate signal during a second part of said clock cycle;

deactivating said static-evaluate signal during a third part of said clock cycle; and preventing said write enable signal from resetting during said second part and said third part of said clock cycle.

10. A method for evaluating a memory array according to claim 1, wherein the step of deactivating said static-evaluate signal comprises the step of deactivating said static-evaluate signal upon the occurrence of a transition of a clock signal.

11. A memory array, comprising:

a plurality of storage cells;

a decoder for decoding a memory address for addressing selected storage cells;

means for asserting a static-evaluate signal to provide a pseudo-static state at least at one evaluation node, said pseudo-static state enabling input signals to the memory array to stabilize to produce a stable signal at the respective evaluation node; and means for deactivating said static-evaluate signal upon the occurrence of a predetermined event to allow said input signals to be presented to the memory array.

12. A memory array according to claim 11, wherein said input signals to the memory array comprise one or more decoded address lines.

13. A memory array according to claim 11, wherein said input signals to the memory array comprise one or more bit lines.

14. A memory array according to claim 11, wherein said input signals to the memory array comprise one or more write enable lines.

15. A memory array according to claim 11, wherein the means for asserting a static-evaluate signal further comprises:

means for asserting one or more reset signals to reset said input signals to the memory array; and means for asserting said static-evaluate signal after all reset signals have been asserted.

16. A memory array according to claim 11, further comprising:

means for resetting a memory decoder during a first part of a clock cycle;

means for asserting said static-evaluate signal during a second part of said clock cycle;

means for deactivating said static-evaluate signal during a third part of said clock cycle; and means for preventing said memory decoder from resetting during said second part and said third part of said clock cycle.

17. A memory array according to claim 11, further comprising:

means for resetting a word line during a first part of a clock cycle;

means for asserting said static-evaluate signal during a second part of said clock cycle;

means for deactivating said static-evaluate signal during a third part of said clock cycle; and means for preventing said word line from resetting during said second part and said third part of said clock cycle.

18. A memory array according to claim 11, further comprising:

means for resetting one or more bit lines during a first part of a clock cycle;

means for asserting said static-evaluate signal during a second part of said clock cycle;

means for deactivating said static-evaluate signal during a third part of said clock cycle; and means for preventing said one or more bit lines from resetting during said second part and said third part of said clock cycle.

19. A memory array according to claim 11, further comprising:

means for resetting a write enable signal during a first part of a clock cycle;

means for asserting said static-evaluate signal during a second part of said clock cycle;

means for deactivating said static-evaluate signal during a third part of said clock cycle; and means for preventing said write enable signal from resetting during said second part and said third part of said clock cycle.

20. A memory array according to claim 11, wherein the means for deactivating said static-evaluate signal comprises means for deactivating said static-evaluate signal upon the occurrence of a transition of a clock signal.

21. A memory array according to claim 11, wherein said means for asserting a static-evaluate signal comprises a leakage transistor.

22. A memory array according to claim 21, wherein said leakage transistor is pulsed.

23. A memory array according to claim 21, wherein said leakage transistor is a pFET.

24. A circuit for controlling a memory array, comprising:

a decoder for decoding a memory address for addressing selected storage cells within the memory array;

means for asserting a static-evaluate signal to provide a pseudo-static state at least at one evaluation node, said pseudo-static state enabling input signals to the memory array to stabilize to produce a stable signal at the respective evaluation node; and means for deactivating said static-evaluate signal upon the occurrence of a predetermined event to allow said input signals to be presented to the memory array.

25. A circuit for controlling a memory array according to claim 24, wherein said input signals to the memory array comprise one or more decoded address lines.

26. A circuit for controlling a memory array according to claim 24, wherein said input signals to the memory array comprise one or more bit lines.

27. A circuit for controlling a memory array according to claim 24, wherein said input signals to the memory array comprise one or more write enable lines.

28. A circuit for controlling a memory array according to claim 24, wherein the means for asserting a static-evaluate signal further comprises:

means for asserting one or more reset signals to reset said input signals to the memory array; and means for asserting said static-evaluate signal after all reset signals have been asserted.

29. A circuit for controlling a memory array according to claim 24, further comprising:

means for resetting a memory decoder during a first part of a clock cycle;

means for asserting said static-evaluate signal during a second part of said clock cycle;

means for deactivating said static-evaluate signal during a third part of said clock cycle; and means for preventing said memory decoder from resetting during said second part and said third part of said clock cycle.

30. A circuit for controlling a memory array according to claim 24, further comprising:

means for resetting a word line during a first part of a clock cycle;

means for asserting said static-evaluate signal during a second part of said clock cycle;

means for deactivating said static-evaluate signal during a third part of said clock cycle; and means for preventing said word line from resetting during said second part and said third part of said clock cycle.

31. A circuit for controlling a memory array according to claim 24, further comprising:

means for resetting one or more bit lines during a first part of a clock cycle;

means for asserting said static-evaluate signal during a second part of said clock cycle;

means for deactivating said static-evaluate signal during a third part of said clock cycle; and means for preventing said one or more bit lines from resetting during said second part and said third part of said clock cycle.

32. A circuit for controlling a memory array according to claim 24, further comprising:

means for resetting a write enable signal during a first part of a clock cycle;

means for asserting said static-evaluate signal during a second part of said clock cycle;

means for deactivating said static-evaluate signal during a third part of said clock cycle; and means for preventing said write enable signal from resetting during said second part and said third part of said clock cycle.

33. A circuit for controlling a memory array according to claim 24, wherein the means for deactivating said static-evaluate signal comprises means for deactivating said static-evaluate signal upon the occurrence of a transition of a clock signal.

34. A circuit for controlling a memory array according to claim 24, wherein said means for asserting a static-evaluate signal comprises a leakage transistor.

35. A circuit for controlling a memory array according to claim 34, wherein said leakage transistor is pulsed.

36. A circuit for controlling a memory array according to claim 34, wherein said leakage transistor is a pFET.

* * * * *